(12) United States Patent
Lin et al.

(10) Patent No.: US 11,508,703 B2
(45) Date of Patent: Nov. 22, 2022

(54) LIGHT EMITTING DEVICE FOR MONITORING SYSTEM

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Yu-Yu Chang, Taipei (TW); Chien-Shun Huang, Changhua County (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 239 days.

(21) Appl. No.: 16/991,157

(22) Filed: Aug. 12, 2020

(65) Prior Publication Data

US 2021/0050333 A1 Feb. 18, 2021

Related U.S. Application Data

(60) Provisional application No. 62/885,872, filed on Aug. 13, 2019.

(30) Foreign Application Priority Data

Aug. 10, 2020 (CN) .......................... 202010796460.5

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01)

(58) Field of Classification Search
CPC combination set(s) only.
See application file for complete search history.

(56) References Cited

U.S. PATENT DOCUMENTS

| | | | |
|---|---|---|---|
| 2017/0250316 A1* | 8/2017 | Yeon | H01L 33/504 |
| 2018/0114875 A1* | 4/2018 | Ho | H01L 31/143 |
| 2019/0165233 A1 | 5/2019 | Horikawa et al. | |

FOREIGN PATENT DOCUMENTS

| | | | |
|---|---|---|---|
| CN | 102263098 A | 11/2011 | |
| CN | 102427075 A | 4/2012 | |

(Continued)

*Primary Examiner* — Ratisha Mehta
(74) *Attorney, Agent, or Firm* — Li & Cai Intellectual Property (USA) Office

(57) ABSTRACT

A light emitting device is provided. The light emitting device includes a package structure, a first light emitting chip, a second light emitting chip, a third light emitting chip, a first encapsulant, a second encapsulant, and a third encapsulant. The first light emitting chip, the second light emitting chip, and the third light emitting chip are disposed in a first cavity, a second cavity, and a third cavity of a body of the package structure, and electrically connected with a first electrode pair, a second electrode pair, and a third electrode pair that are covered by the body. The first encapsulant, the second encapsulant, and the third encapsulant are filled in the first cavity, the second cavity, and the third cavity. A first opening of the first cavity is larger in size than a second opening of the second cavity and a third opening of the third cavity.

13 Claims, 15 Drawing Sheets

(56) References Cited

FOREIGN PATENT DOCUMENTS

| CN | 104157770 A | 11/2014 |
|----|-------------|---------|
| CN | 205911310 U | 1/2017 |
| CN | 109027779 A | 12/2018 |
| CN | 209119097 U | 7/2019 |

* cited by examiner

LIGHT EMITTING DEVICE FOR MONITORING SYSTEM

CROSS-REFERENCE TO RELATED PATENT APPLICATION

This application claims the benefit of priority to China Patent Application No. 202010796460.5, filed on Aug. 10, 2020 in People's Republic of China. The entire content of the above identified application is incorporated herein by reference.

This application claims priority to the U.S. Provisional Patent Application Ser. No. 62/885,872, filed Aug. 13, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting device, and more particularly to a light emitting device that is suitable for being applied in a monitoring system for facial image capturing or a recognition system for car plate recognition.

BACKGROUND OF THE DISCLOSURE

In an existing monitoring system for facial image capturing or recognition system for car plate recognition, an infrared light emitting diode is generally used as a sensing light source. However, a portion of light emitted by the infrared light emitting diode is in red light range. As such, a red light dot (red spot phenomenon) is shown on an exterior of a conventional system, which may easily attract attention from people, such that the desired monitoring effect is not achieved, or the safety of passersby is affected.

To eliminate the red spot phenomenon, an infrared light emitting diode and a blue light emitting diode has been encapsulated in a PLCC 6 package with one single cup and add phosphor in its encapsulant to form a light emitting device. In this way, the blue light emitting diode and the phosphor form white light, which can neutralize a red spot generated by the infrared light emitting diode. However, in the design of such a light emitting device, the phosphor would also be placed on the infrared light emitting diode, causing a loss of infrared energy. Furthermore, a traditional PLCC 6 package is designed to have bent pins and is large in size, which is not advantageous for developing toward microminiaturization of end products.

SUMMARY OF THE DISCLOSURE

The present disclosure provides a light emitting device, which is mainly configured to improve a conventional light emitting device applied in an existing monitoring system for facial image capturing or recognition system for car plate recognition. An encapsulant of the conventional light emitting device that is filled with phosphor is placed not only on a blue light emitting diode but also on an infrared light emitting diode, thereby causing a problem of infrared energy loss.

In one aspect, the present disclosure provides a light emitting device including a package structure, a first light emitting chip, a second light emitting chip, a third light emitting chip, a first encapsulant, a second encapsulant, and a third encapsulant. The package structure includes a first electrode pair, a second electrode pair, a third electrode pair, and a body covering the first electrode pair, the second electrode pair, and the third electrode pair. The body includes a first cavity, a second cavity, and a third cavity that are disposed corresponding to the first electrode pair, the second electrode pair, and the third electrode pair, respectively, and that expose the first electrode pair, the second electrode pair, and the third electrode pair, respectively. The first light emitting chip, the second light emitting chip, and the third light emitting chip are disposed in the first cavity, the second cavity, and the third cavity, respectively, and are electrically connected with the first electrode pair, the second electrode pair, and the third electrode pair, respectively. The first encapsulant, the second encapsulant, the third encapsulant are disposed in the first cavity, the second cavity, and the third cavity, respectively, and cover the first light emitting chip, the second light emitting chip, and the third light emitting chip, respectively. Further, the first cavity, the second cavity, and the third cavity have a first opening, a second opening, and a third opening, respectively. An area of the first opening is larger in size than an area of the second opening, and the area of the first opening is larger in size than an area of the third opening. Further, a wavelength of a light emitted by the first light emitting chip is different from a wavelength of a light emitted by the second light emitting chip, and the wavelength of the light emitted by the first light emitting chip is different from a wavelength of a light emitted by the third light emitting chip.

Preferably, the first light emitting chip emits an infrared light.

Preferably, the second light emitting chip and the third light emitting chip emit a blue light.

Preferably, the second encapsulant and the third encapsulant each contain a wavelength conversion material. Lights emitted by the second light emitting chip and the third light emitting chip, after respectively passing through the second encapsulant and the third encapsulant, are partially converted and mixed into white light.

Preferably, a color temperature of the white light ranges from 2500 Kelvin (K) to 6500 Kelvin (K).

Preferably, the light emitting device further includes a lens being disposed on a top surface of the body.

Preferably, the light emitting device further incudes a reflective filler that is filled in the first cavity, and is located between the first encapsulant and the first electrode pair. The reflective filler covers the first electrode pair and encloses a side surface of the first light emitting chip.

Preferably, from a top view of the light emitting device, the area of the first opening is two to three times that of the second opening, and the area of the first opening is two to three times that of the third opening.

Preferably, the body further includes a first partition wall and a second partition wall. The first partition wall is located between the first cavity and the second cavity, and the second partition wall is located between the first cavity and the third cavity. The first partition wall and the second partition wall each have two curved segments.

Preferably, a height of the first partition wall is equal to a height of the second partition wall.

Preferably, one curved segment of the first partition wall bends toward the second cavity, and another curved segment of the first partition wall bends toward the first cavity. One curved segment of the second partition wall bends toward the third cavity, and another curved segment of the second partition wall bends toward the first cavity.

Preferably, the body further includes a first low wall, a second low wall, and a third low wall that are disposed in the first cavity, the second cavity, and the third cavity, respectively.

Preferably, the body includes an auxiliary low wall, the first electrode pair includes an auxiliary fitting portion, and the auxiliary low wall and the auxiliary fitting portion are fitted to each other and cover part of the first electrode pair.

In conclusion, when the light emitting device of the present disclosure is applied as a light emitting device in a monitoring system for facial image capturing or a recognition system for car plate recognition, the first encapsulant, the second encapsulant, and the third encapsulant are disposed in the first cavity, the second cavity, and the third cavity, respectively. Therefore, unlike the above-mentioned conventional light emitting device in the monitoring system for facial image capturing or recognition system for car plate recognition that has an encapsulant with phosphor placed on the infrared light emitting diode, the problem of infrared energy loss would not occur in the light emitting device of the present disclosure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
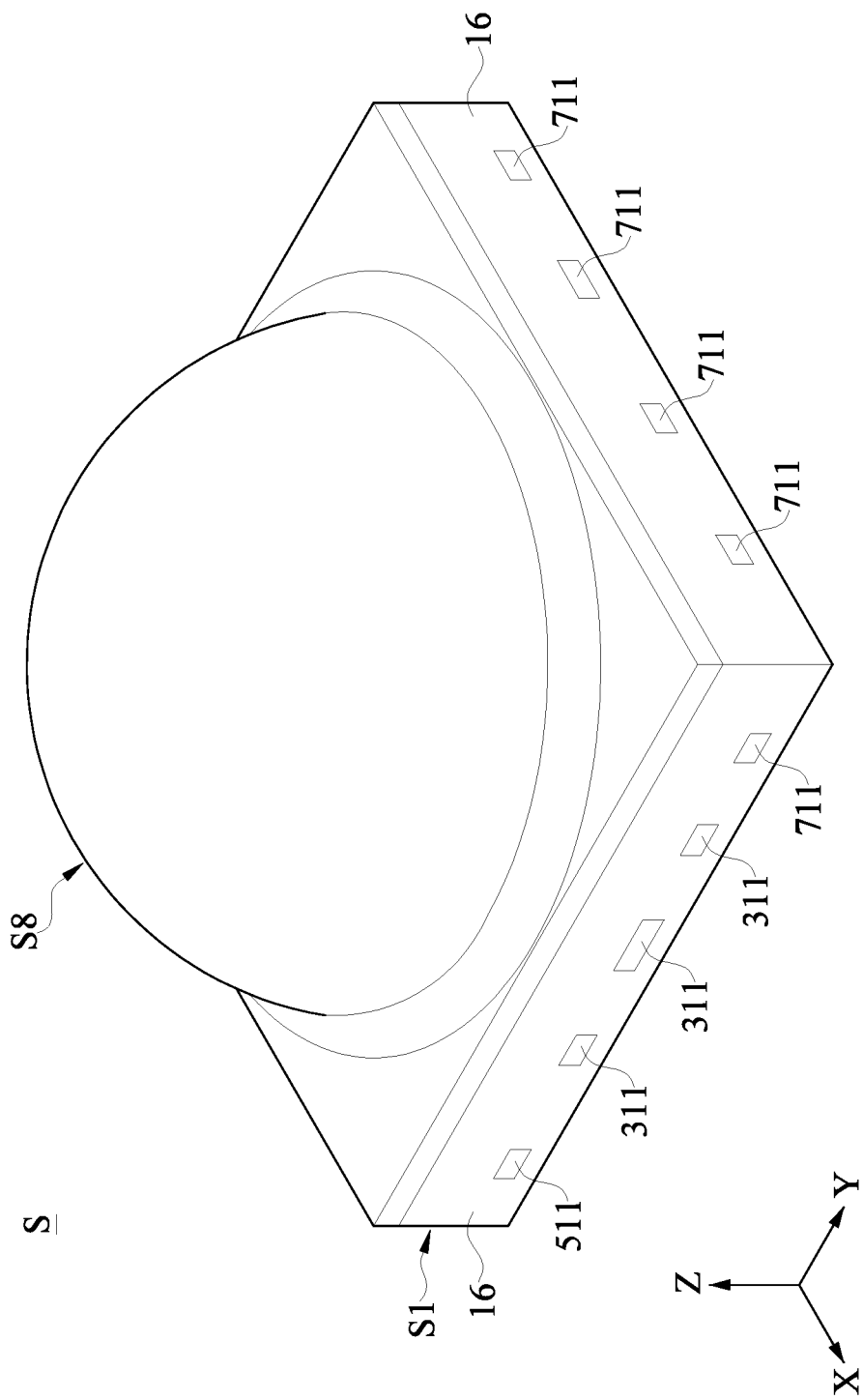
FIG. 1, FIG. 2, and FIG. 3 are schematic views of a light emitting device of the present disclosure from different perspectives.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
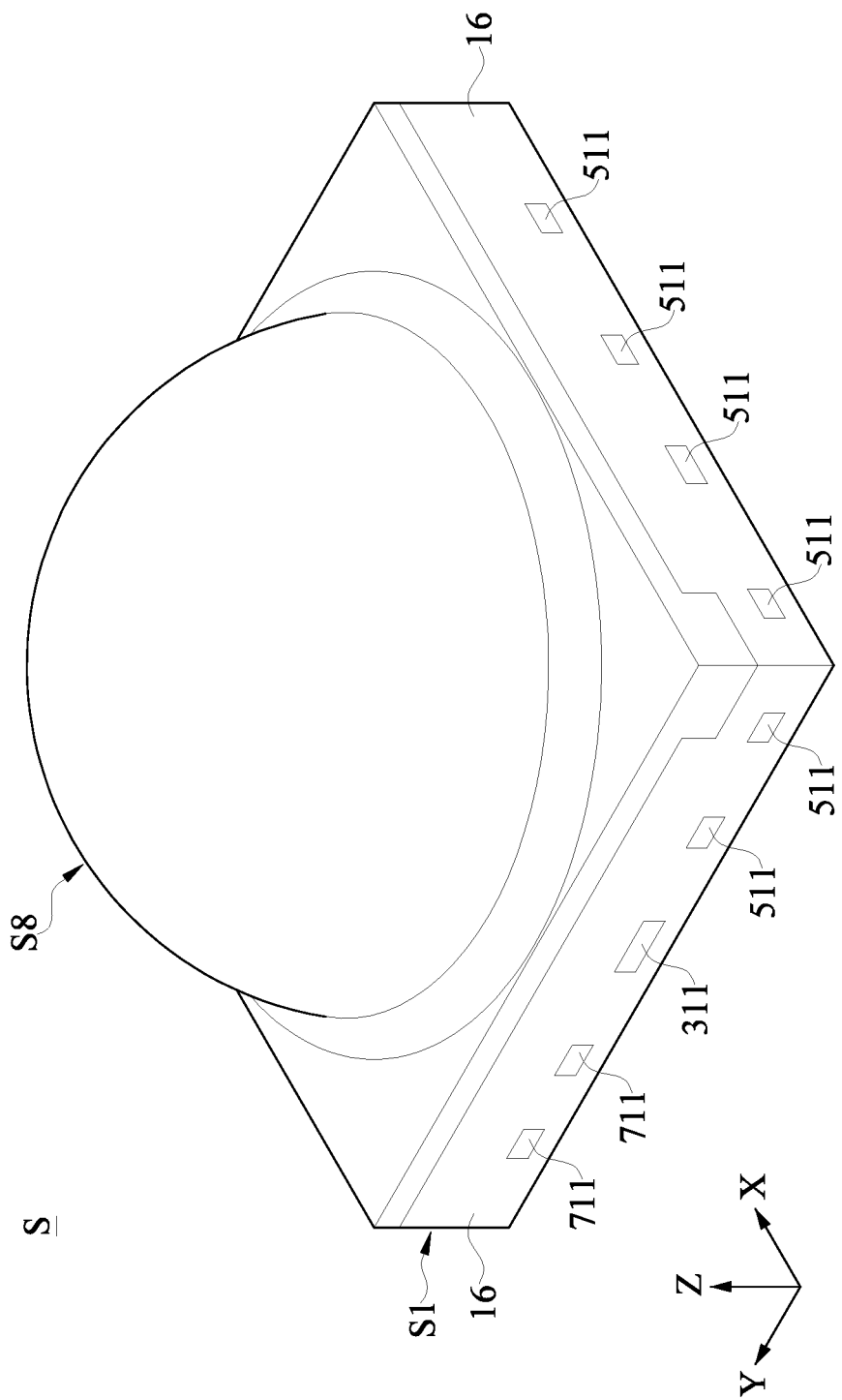
Figure 3:
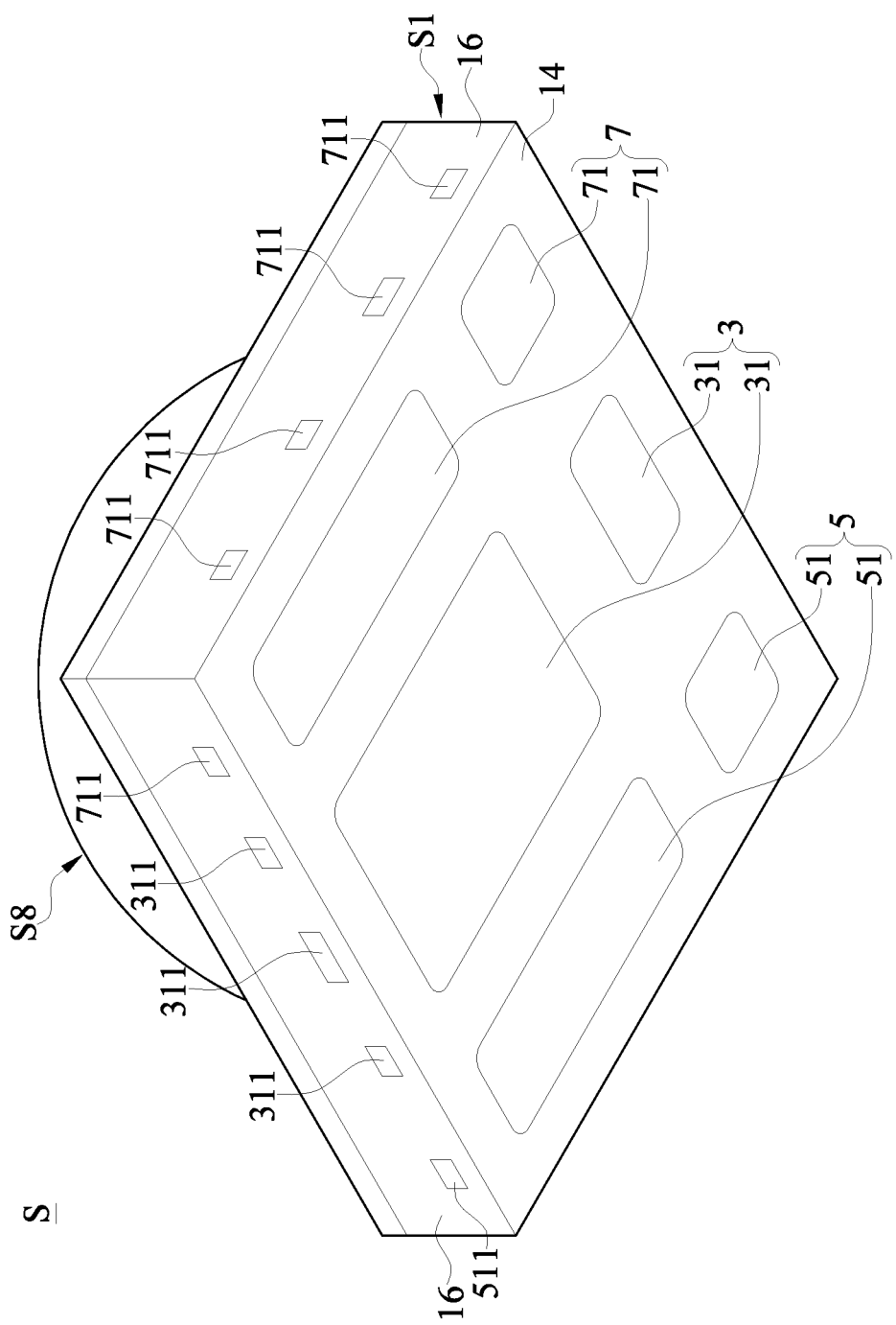
Figure 4:
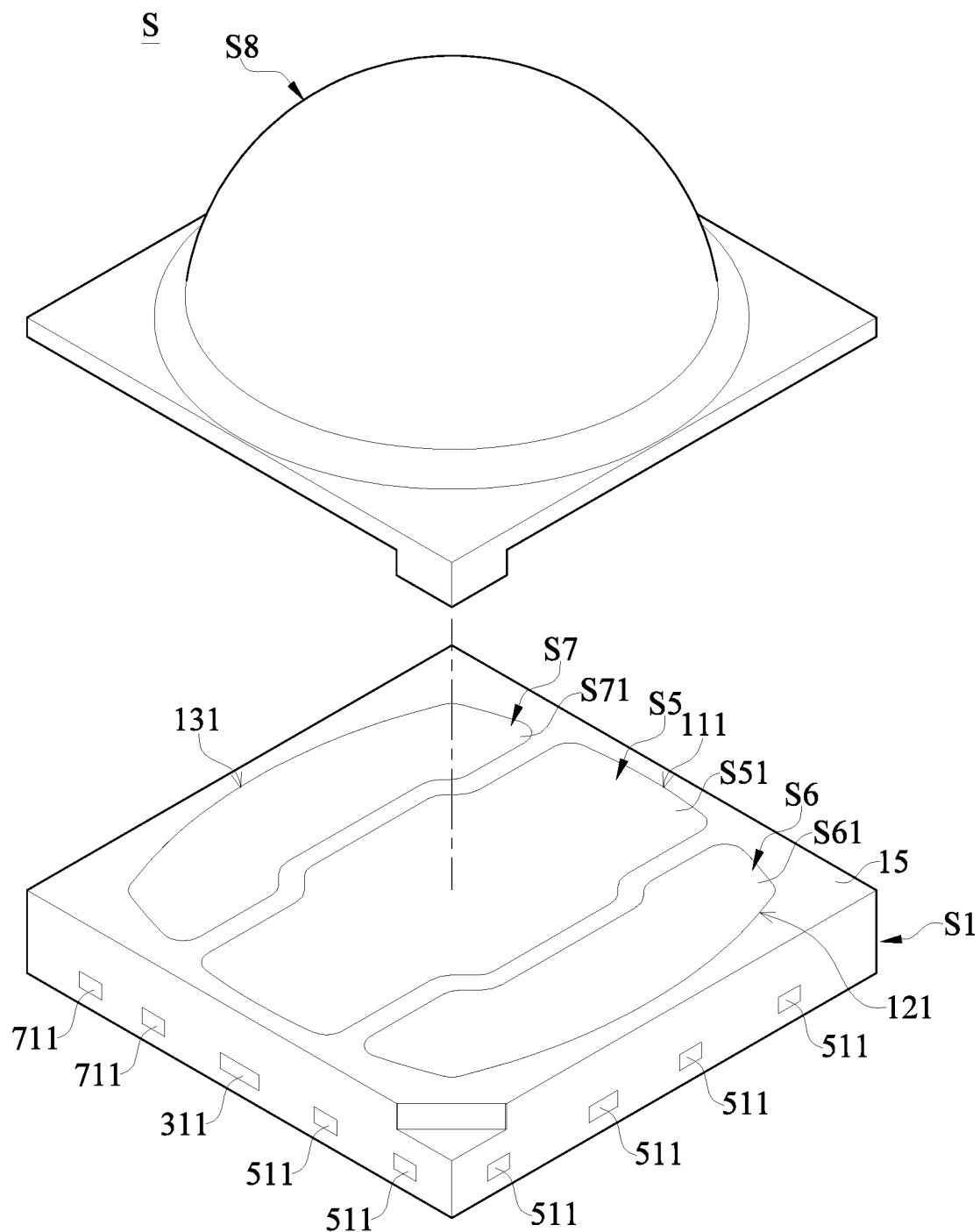
FIG. 4 is a partial exploded schematic view of the light emitting device of the present disclosure.
Figure 5:
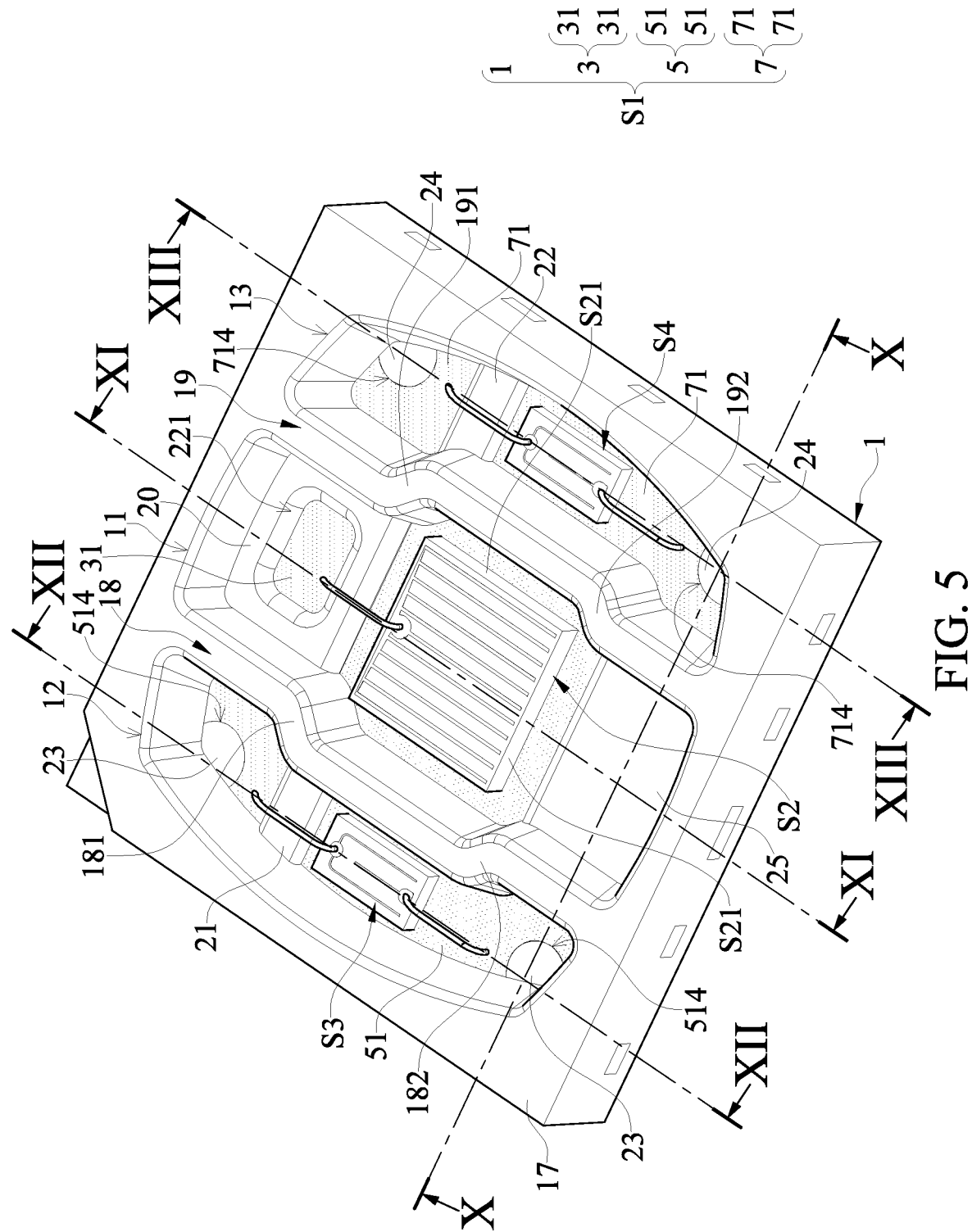
FIG. 5 is a schematic view of the light emitting device of the present disclosure without having a first encapsulant, a second encapsulant, and a third encapsulant disposed thereon.
Figure 6:
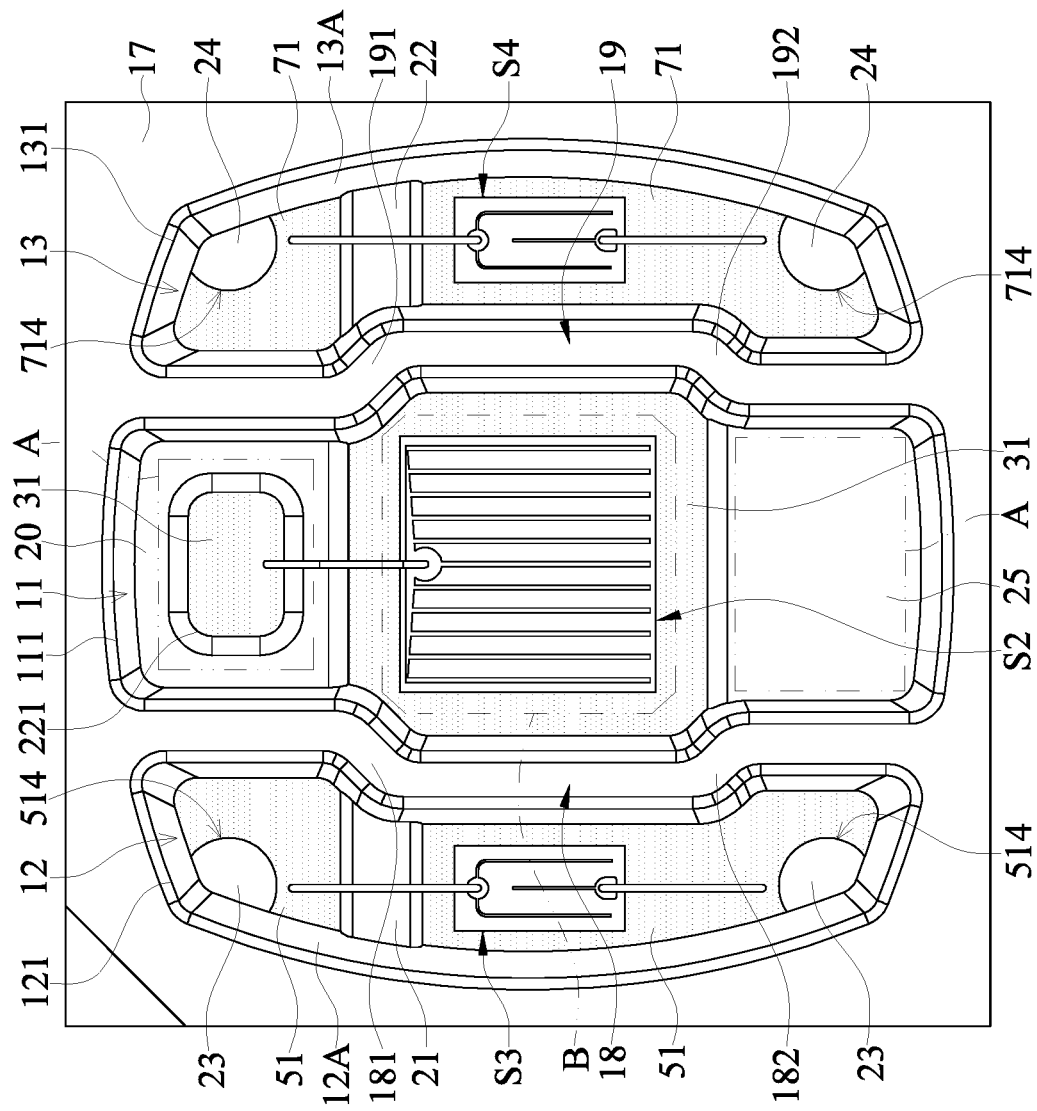
FIG. 6 is a top schematic view of FIG. 5.

References are made to FIG. 1 to FIG. 6, in which FIG. 1, FIG. 2, and FIG. 3 are schematic views of a light emitting device of the present disclosure from different perspectives, FIG. 4 is a partial exploded schematic view of the light emitting device of the present disclosure, FIG. 5 is a schematic view of the light emitting device of the present disclosure without having a first encapsulant, a second encapsulant, and a third encapsulant disposed thereon, and FIG. 6 is a top schematic view of FIG. 5.

A light emitting device Sincludes a package structure S1, a first light emitting chip S2, a second light emitting chip S3, a third light emitting chip S4, a first encapsulant S5, a second encapsulant S6, a third encapsulant S7, and a lens S8. In a different embodiment, the light emitting device Scould be without the lens S8.

The package structure Si includes a body 1, a first electrode pair 3, a second electrode pair 5, and a third electrode pair 7. The body 1 covers the first electrode pair 3, the second electrode pair 5, and the third electrode pair 7. In addition, the first electrode pair 3, the second electrode pair 5, and the third electrode pair 7 are electrically independent from each other. The body 1 includes a first cavity 11, a second grove 12, and a third cavity 13 that are arranged in a row and are spaced apart from each other. Further, the first cavity 11 is located between the second cavity 12 and the third cavity 13. In practice, the body 1 can be formed by epoxy molding compound (EMC), but the present disclosure is not limited thereto.

The first cavity 11, the second cavity 12 and the third cavity 13 are disposed corresponding to the first electrode pair 3, the second electrode pair 5, and the third electrode pair 7, respectively. A part of the first electrode pair 3, a part of the second electrode pair 5, and a part of the third electrode pair 7 are correspondingly exposed from the first cavity 11, the second cavity 12, and the third cavity 13. Further, a part of the first electrode pair 3, a part of the second electrode pair 5, and a part of the third electrode pair 7 are correspondingly exposed from a bottom surface 14 of the body 1 (as shown in FIG. 3). In addition, the first cavity 11, the second cavity 12, and the third cavity 13 have a first opening 111, a second opening 121, and a third opening 131, respectively. An area of the first opening 111 is larger in size than an area of the second opening 121, and the area of the first opening 111 is larger in size than an area of the third opening 131. In a preferred application, from a top view of the light emitting device S(as shown in FIG. 6), the area of the first opening 111 is two to three times that of the second opening 121 and two to three times that of the third opening 131. Preferably, the second opening 121 is equal in size to the third opening 131.

The first light emitting chip S2, the second light emitting chip S3, and the third light emitting chip S4 are disposed in the first cavity 11, the second cavity 12, and the third cavity 13, respectively. In addition, the first light emitting chip S2, the second light emitting chip S3, and the third light emitting chip S4 are electrically connected with the first electrode pair 3, the second electrode pair 5, and the third electrode pair 7, respectively. Further, a wavelength of a light emitted by the first light emitting chip S2 is different from a wavelength of a light emitted by the second light emitting chip S3, and the wavelength of the light emitted by the first light emitting chip S2 is different from a wavelength of a light emitted by the third light emitting chip S4. For example, the first light emitting chip S2 can emit light in an invisible light range (preferably light in an infrared range), while the second light emitting chip S3 and the third light emitting chip S4 emit light in a visible light range or in an ultraviolet range.

In practice, the wavelength of the light emitted by the second light emitting chip S3 is substantially the same as the wavelength of the light emitted by the third light emitting chip S4. That is to say, a deviation value between a wavelength of the light emitted by the second light emitting chip S3 and a avelength of the light emitted by the third light emitting chip S4 is no greater than 5 nanometers (nm).

The first encapsulant S5, the second encapsulant S6, and the third encapsulant S7 are disposed in the first cavity 11, the second cavity 12, and the third cavity 13, respectively. In addition, the first encapsulant S5, the second encapsulant S6, and the third encapsulant S7 cover the first light emitting chip S2, the second light emitting chip S3, and the third light emitting chip S4, respectively. Lights respectively emitted by the first light emitting chip S2, the second light emitting chip S3, and the third light emitting chip S4, after passing through the first encapsulant S5, the second encapsulant S6, and the third encapsulant S7, are emitted outward.

In certain embodiments, the second encapsulant S6 can contain a wavelength conversion material, and light emitted by the second light emitting chip S3 (preferably a blue light or a near ultraviolet light), after passing through the second encapsulant S6, is partially converted and mixed into white light, that, for example, has a color temperature ranging from 2500 Kelvin (K) to 6500 Kelvin (K). Similarly, the third encapsulant S7 can contain the wavelength conversion material, and light emitted by the third light emitting chip S4 (preferably a blue light or a near ultraviolet light), after passing through the third encapsulant S7, is partially converted and mixed into white light, that, for example, has a color temperature ranging from 2500 Kelvin (K) to 6500 Kelvin (K). The wavelength conversion material, for example, is phosphor.

As shown in FIG. 4, an upper surface S51 of the first encapsulant S5, an upper surface S61 of the second encapsulant S6, an upper surface S71 of the third encapsulant S7, and a top surface 15 of the body 1 are flush with each other. The lens S8 is disposed on the top surface 15 of the body 1, and the lens S8 correspondingly covers the upper surface S51 of the first encapsulant S5, the upper surface S61 of the second encapsulant S6, and the upper surface S71 of the third encapsulant S7. A configuration of the lens S8 as shown in FIG. 4 is merely one illustrative example. In practice, the configuration of the lens S8 can be changed according to requirements.

The light emitting device Scan be applied in devices for facial image capturing, car plate recognition, etc. Preferably, when the light emitting device S of the present disclosure is applied in the devices for facial image capturing and car plate recognition, a light emitting diode that emits an infrared light (IR) with a wavelength of 750 nanometers (nm), a wavelength of 670 nanometers (nm), a wavelength of 850 nanometers (nm), or a wavelength of 940 nanometers (nm) is selected for the first light emitting chip S2, and white light with a color temperature of 3000 K is generated after part of a light emitted by the second light emitting chip S3 and part of a light emitted by the third light emitting chip S4 pass through the second encapsulant S6 and the third encapsulant S7 that contain phosphor, respectively. In a different embodiment, a vertical-cavity surface-emitting laser (VCSEL) with a wavelength of 670 nanometers (nm) can be selected for the first light emitting chip S2 to increase an irradiation distance of the first light emitting chip S2, while a blue light emitting diode with a wavelength of 470 nanometers (nm) can be selected for the second light emitting chip S3 and the third light emitting chip S4. Further, an encapsulant filled with phosphor particles can be selected for the second encapsulant S6 and the third encapsulant S7, so that part of a light emitted by the second light emitting chip S3 and part of a light emitted by the third light emitting chip S4, after passing through the second encapsulant S6 and the third encapsulant S7, are partially converted and mixed into white light.

It is worth mentioning that, as shown in table below, the above-mentioned package structure S1 can be applied in various fields. According to the field in which the package structure S1 is applied, the first cavity, the second cavity, and the third cavity of the package structure S1 can have different types of chips and wavelength conversion materials disposed therein.

| Second cavity | First cavity | Third cavity | Application Field |
|---|---|---|---|
| A combination of a chip and phosphor that is capable of emitting white light at a color temperature of 3000 K | A chip that is capable of emitting an infrared light with a wavelength of 850 nm<br>A chip that is capable of emitting an infrared light with a wavelength of 750 nm<br>A chip that is capable of emitting an infrared light with a wavelength of 730 nm<br>A chip that is capable of emitting an infrared light with a wavelength of 530 nm | A combination of a chip and phosphor that is capable of emitting white light at a color temperature of 3000 K | Intelligent traffic (for example, car plate recognition, facial image capturing, etc.) |
| A combination of a chip and phosphor that is capable of emitting white light at a color temperature of 3000 K | A chip that is capable of emitting an infrared light with a wavelength of 750 nm<br>A chip that is capable of emitting an infrared light with a wavelength of 670 nm<br>A vertical-cavity surface-emitting laser (VCSEL) chip that is capable of emitting an infrared light with a wavelength of 670 nm | Nil | |
| A combination of a chip and phosphor that is capable of emitting a white light at a color temperature of 3000 K | A chip that is capable of emitting an infrared light with a wavelength of 750 nm | A chip that is capable of emitting an infrared light with a wavelength of 940 nm | |
| A chip that is capable of emitting a blue light with a wavelength of 450 nm | A chip that is capable of emitting an infrared light with a wavelength of 630 nm | Nil | Intelligent traffic (for example, warning lights of police cars, etc.) |
| A chip that is capable of emitting an infrared light with a wavelength of 850 nm | A chip that is capable of emitting an infrared light with a wavelength of 750 nm | A chip that is capable of emitting an infrared light with a wavelength of 940 nm | Intelligent traffic (for example, car plate recognition, facial image capturing, night-time full-color fill light, etc.) |
| A chip that is capable of emitting an infrared light witha wavelength of 850 nm or 940 nm | Photodiode | A chip that is capable of emitting a blue light with a wavelength of 470 nm | Smoke detection |

Figure 7:
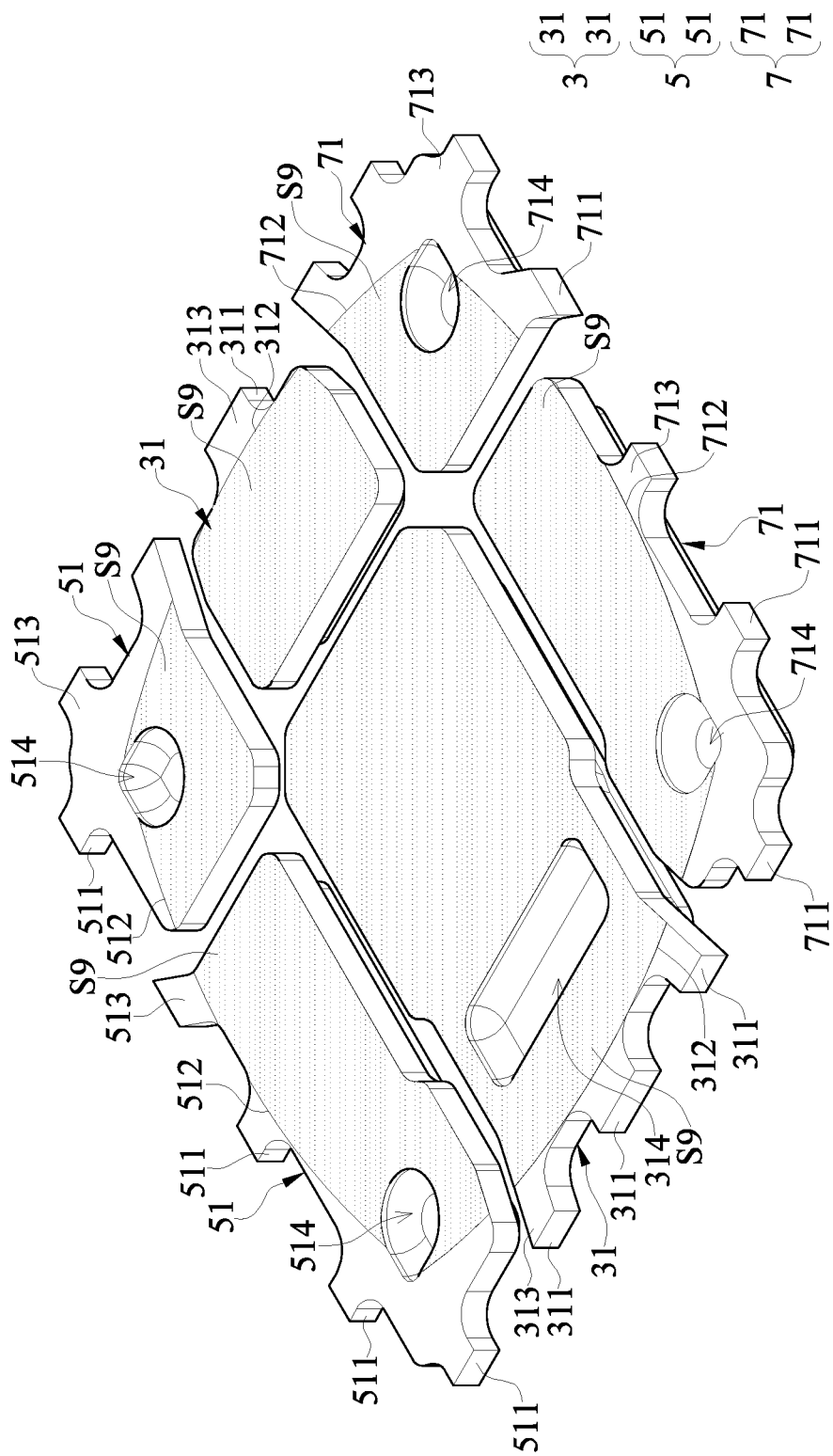
FIG. 7 is a schematic view of a first electrode pair, a second electrode pair, and a third electrode pair of the light emitting device of the present disclosure.
Figure 8:
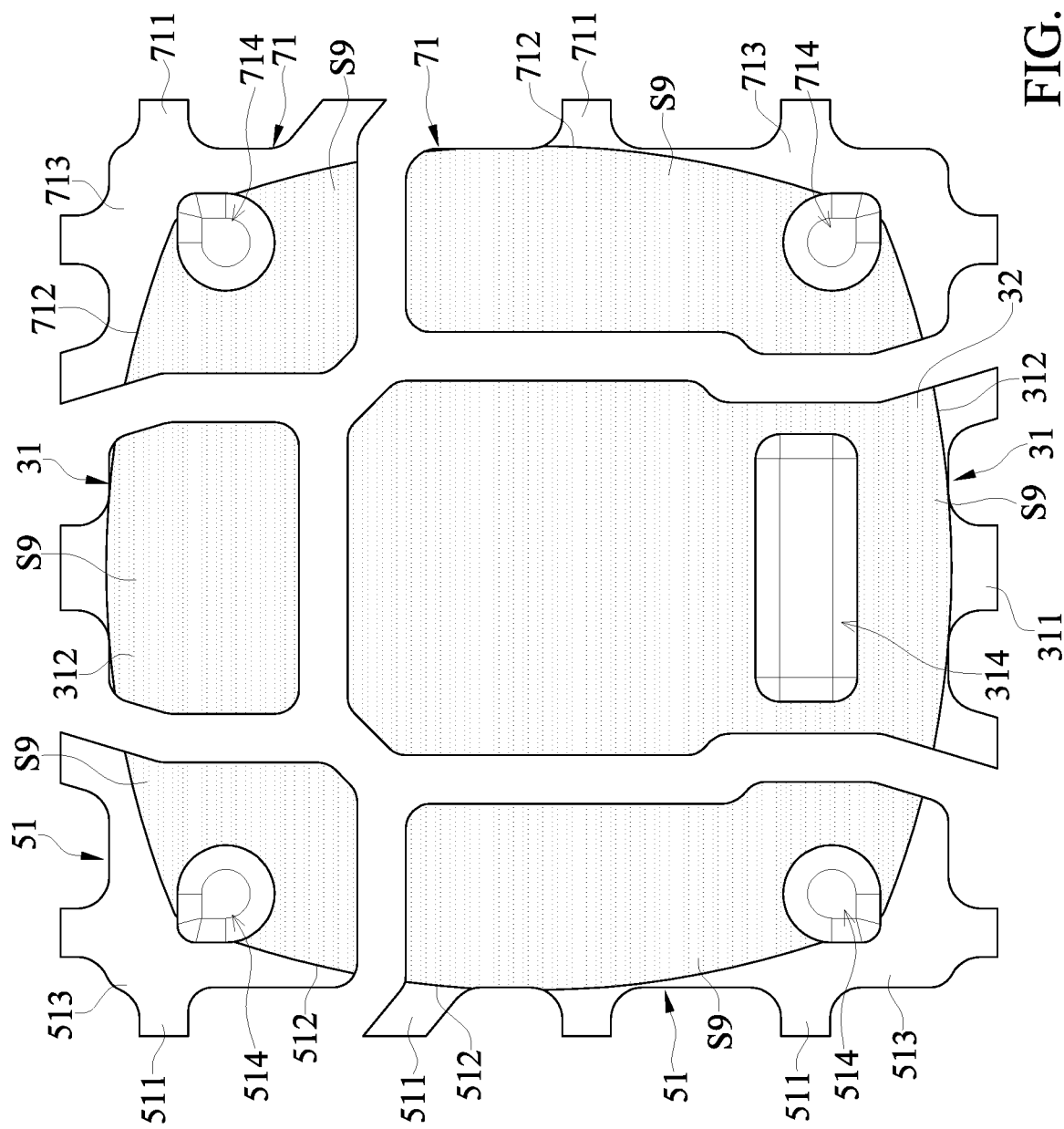
FIG. 8 is a top view of FIG. 7.

References are made to FIG. 5 to FIG. 8, in which FIG. 6 is a top schematic view of FIG. 5, FIG. 7 is a schematic view of the first electrode pair, the second electrode pair, and the third electrode pair of the light emitting device (the package structure S1) of the present disclosure, and FIG. 8 is a top view of FIG. 7. The first electrode pair 3 includes two first electrode sheets 31, the second electrode pair 5 includes two second electrode sheets 51, and the third electrode pair 7 includes two third electrode sheets 71. With respect to configuration, size, etc., each of the first electrode sheets 31, each of the second electrode sheets 51, and each of the electrode sheets 71 can be changed according to requirements. What is shown in the figures is merely one of the illustrative examples.

The two first electrode sheets 31 that are spaced apart from each other are covered by the body 1, the two second electrode sheets 51 that are spaced apart from each other are covered by the body 1, and the two third electrode sheets 71 that are spaced apart from each other are covered by the body 1. Further, each of the first electrode sheets 31, each of the second electrode sheets 51, and each of the electrode sheets 71, are disposed in the body 1 and spaced apart from one another.

As shown in FIG. 1, FIG. 2, and FIG. 7, each of the first electrode sheets 31 of the first electrode pair 3 has a plurality of first extension portions 311, and a part of each of the first extension portions 311 is exposed from one of side surfaces 16 of the body 1. Each of the second electrode sheets 51 of the second electrode pair 5 has a plurality of second extension portions 511, and a part of each of the second extension portions 511 is exposed from one of the side surfaces 16 of the body 1. Each of the third electrode sheets 71 of the third electrode pair 7 has at least one third extension portion 711, and a part of each of the third extension portions 711 is exposed from one of the side surfaces 16 of the body 1. Further, the each of the first extension portions 311, the each of the second extension portions 511, and the each of the third extension portions 711 can be exposed from three different side surfaces 16 of the body 1, respectively. Each of the first extension portions 311, each of the second extension portions 511, and each of the third extension portions 711 that are exposed from the body 1 may be electrically connected to a variety of external microprocessors. In this way, the microprocessors can independently control the first light emitting chip S2, the second light emitting chip S3, and the third light emitting chip S4.

Figure 10:
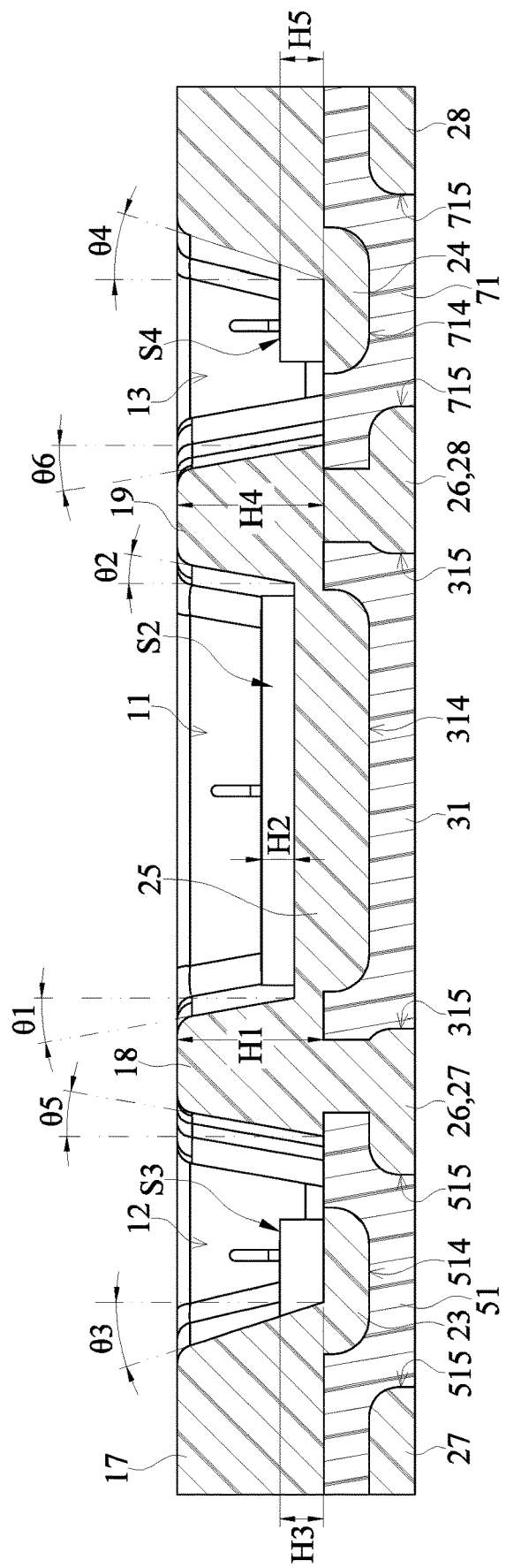
FIG. 10 is a sectional schematic view taken along line X of FIG. 5.

Referring to FIG. 10, which is to be read in conjunction with FIG. 5, FIG. 6, and FIG. 7, a sectional schematic view of the light emitting device of the present disclosure without having the lens, the first encapsulant, the second encapsulant, and the third encapsulant disposed thereon is shown. The body 1 is segmented into an outer wall 17, a first partition wall 18, and a second partition wall 19. The outer wall 17, the first partition wall 18, and the second partition wall 19 are connected with each other, to thereby together form the first cavity 11, the second cavity 12, and the third cavity 13. That is to say, the first partition wall 18 is located between the first cavity 11 and the second cavity 12, and the second partition wall 19 is located between the first cavity 11 and the third cavity 13. As shown in FIG. 10, a height H1 of the first partition wall 18 is greater than a height H2 of the first light emitting chip S2, and the height H1 of the first partition wall 18 is greater than a height H3 of the second light emitting chip S3. A height H4 of the second partition wall 19 is greater than the height H2 of the first light emitting chip S2, and the height H4 of the second partition wall 19 is greater than a height H5 of the third light emitting chip S4. The first partition wall 18 is capable of preventing light emitted by the first light emitting chip S2 to interfere with light emitted by the second light emitting chip S3. The second partition wall 19 is capable of preventing the light emitted by the first light emitting chip S2 to interfere with light emitted by the third light emitting chip S4. In practice, the height H1 of the first partition wall 18 is equal to the height H4 of the second partition wall 19, but is not limited thereto. Further, a thickness of the first partition wall 18 can be approximately the same as a thickness of the second partition wall 19, but is not limited thereto.

In the present disclosure, the first cavity 11, the second cavity 12, and the third cavity 13 are shown in a closely arranged manner, so as to reduce the size of the light emitting device (the package structure). As shown in FIG. 5 and FIG. 6, the first partition wall 18 has two curved segments 181 and 182. One curved segment 181 of the first partition wall 18 bends toward the second cavity 12, and another curved segment 182 of the first partition wall 18 bends toward the first cavity 11. The second partition wall 19 has two curved segments 191, 192. One curved segment 191 of the second partition wall 19 bends toward the third cavity 13, and another curved segment 192 of the second partition wall 19 bends toward the first cavity 11. As shown in FIG. 6, from a top view of the body 1, the first cavity 11 can be formed together by two rectangles A and an octagon B. Plainly speaking, a configuration of the first cavity 111 is wide in the middle and narrow at upper and lower ends.

The strength of a mechanical structure of the body 1 can be greatly increased through a design of the first partition wall 18 having the two curved segments 181, 182 and the second partition wall 19 having the two curved segments 191, 192. More specifically, in an embodiment in which the first partition wall 18 does not have the two curved segments 181, 182 and the second partition wall 19 does not have the two curved segments 191, 192, when the light emitting device Sis subjected to unexpected impact from an external force, it is easy for stress to concentrate on two ends of the first partition wall 18 and two ends of the second partition wall 19, causing the two ends of the first partition wall 18 and the two ends of the second partition wall 19 to break. Conversely, when the first partition wall 18 has the two curved segments 181, 182, and the second partition wall 19 has the two curved segments 191, 192, the above-mentioned problem is unlikely to occur.

Figure 11:
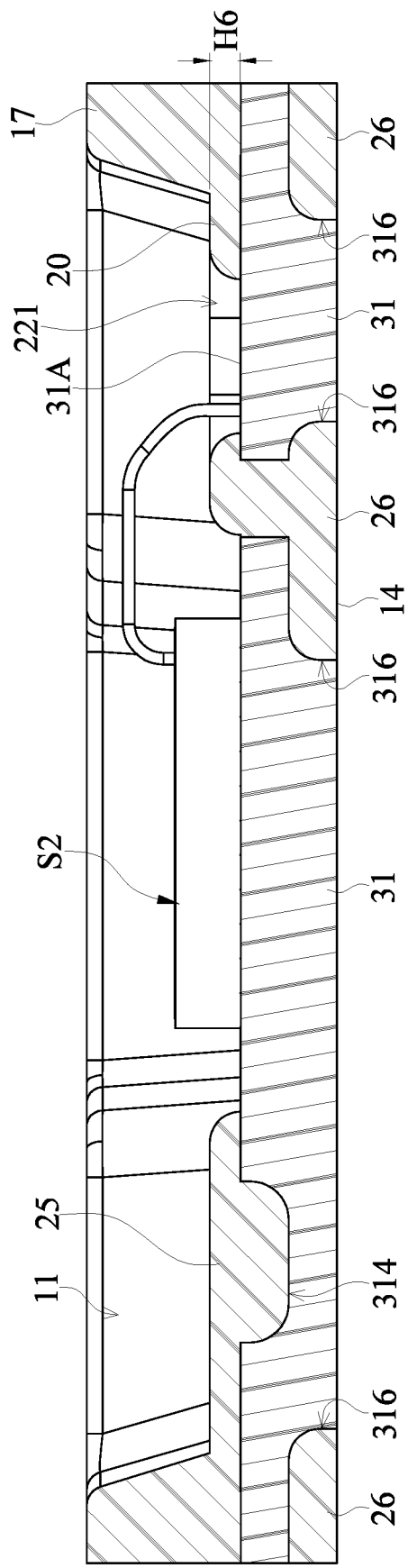
FIG. 11 is a sectional schematic view taken along line XI of FIG. 5.
Figure 12:
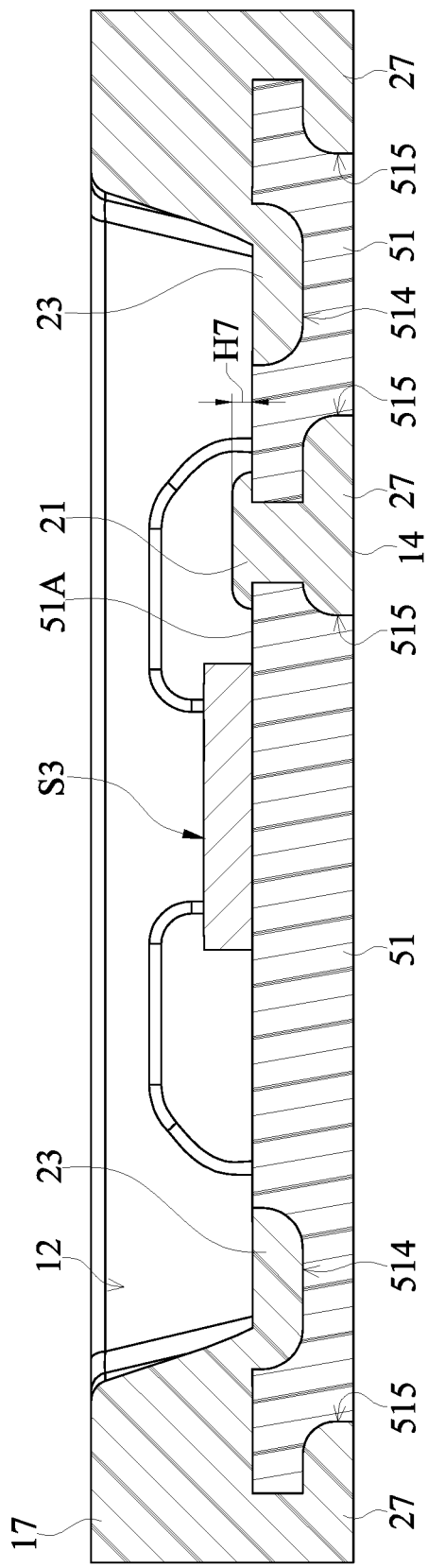
FIG. 12 is a sectional schematic view taken along line XII of FIG. 5.
Figure 13:
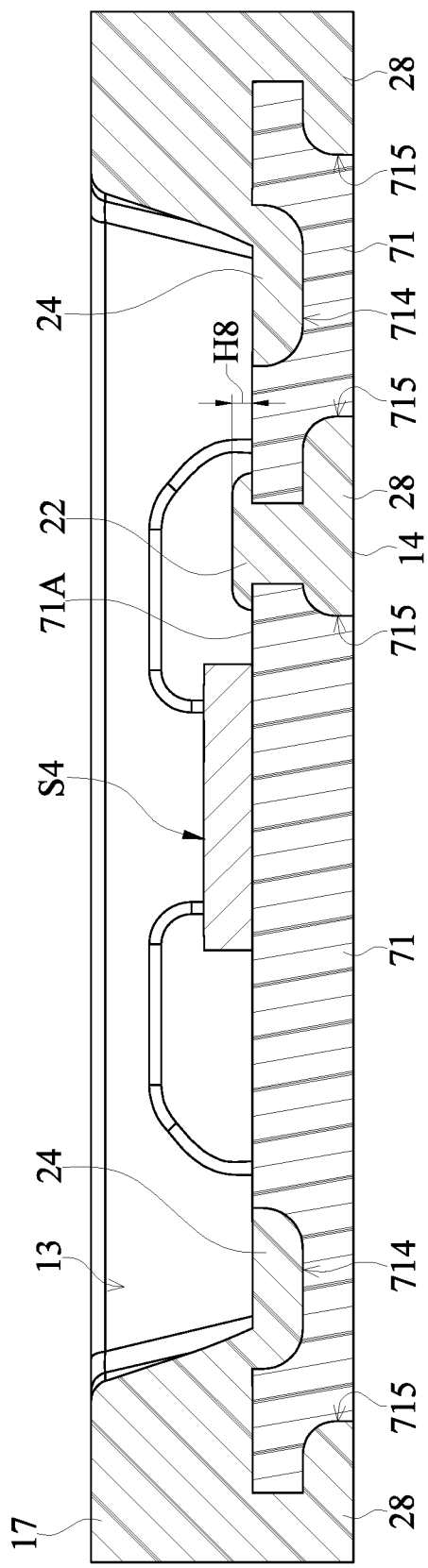
FIG. 13 is a sectional schematic view taken along line XIII of FIG. 5.
Figure 14:
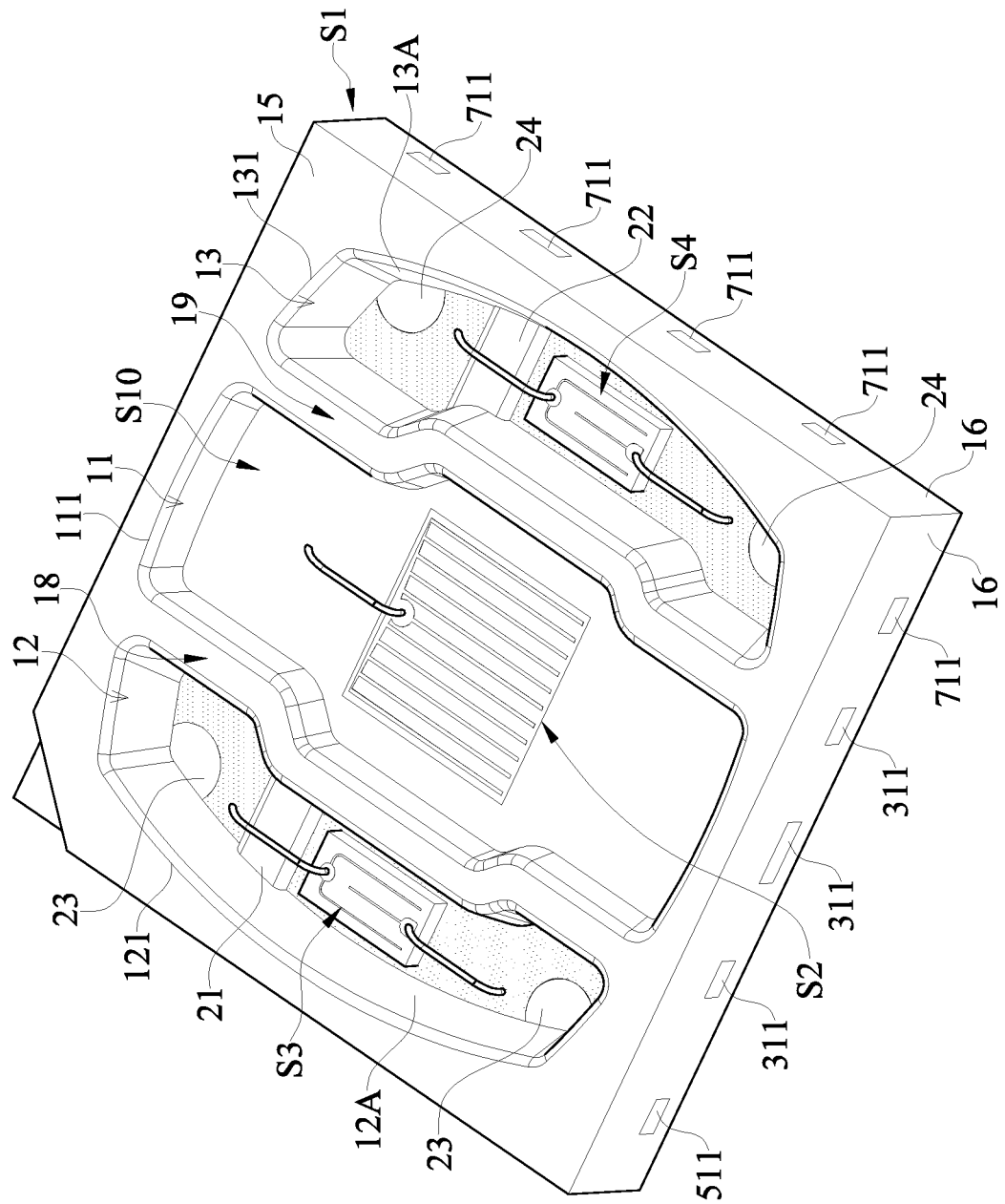
FIG. 14 is a schematic view of another embodiment of the light emitting device of the present disclosure without having the first encapsulant, the second encapsulant, and the third encapsulant disposed thereon.

Referring to FIG. 11, which is to be read in conjunction with FIG. 5, FIG. 6, and FIG. 10, another sectional schematic view of the light emitting device of the present disclosure without having the lens, the first encapsulant, the second encapsulant, and the third encapsulant disposed thereon is shown. The body 1 can further include a first low wall 20, a second low wall 21, and a third low wall 22. The first low wall 20 is located in the first cavity 11, and the first low wall 20 is disposed on a top surface 31A of a first electrode sheet 31 of the first electrode pair 3 that is exposed from the first cavity 11 (as shown in FIG. 11). A height H6 of the first low wall 20 is smaller than the height H1 of the first partition wall 18 (as shown in FIG. 10), and the height H6 of the first low wall 20 is smaller than the height H4 of the second partition wall 19. The second low wall 21 is located in the second cavity 12, and the second low wall 21 is disposed on a top surface 51A of a second electrode sheet 51 of the second electrode pair 5 that is exposed from the second cavity 12 (as shown in FIG. 12). A height H7 of the second low wall 21 (as shown in FIG. 12) is smaller than the height H1 of the first partition wall 18 (as shown in FIG. 10). The third low wall 22 is located in the third cavity 13, and is disposed on a top surface 71A of a third electrode sheet 71 of the third electrode pair 7 that is exposed from the third cavity 13 (as shown in FIG. 13), and a height H8 of the third low wall 22 (as shown in FIG. 10) is smaller than the height H4 of the second partition wall 19 (as shown in FIG. 10).

As shown in FIG. 5, in practice, the second light emitting chip S3 is fixed at one of the second electrode sheets 51, and is electrically connected with another one of the second electrode sheets 51 through a conductive wire. The conductive wire crosses over the second low wall 21. The third light emitting chip S4 is fixed at one of the third electrode sheets 71, and is electrically connected with another one of the third electrode sheets 71 through a conductive wire. The conductive wire crosses over the third low wall 22.

In practice, in an embodiment in which the body 1 covers the first electrode pair 3, the second electrode pair 5, and the third electrode pair 7 by molding, the stability of the body 1 when being formed can be effectively increased through a design of the first partition wall 18, the first low wall 20, the second low wall 21, the third low wall 22, etc. In addition, the strength of mechanical connection between the body 1 and the first electrode pair 3, the second electrode pair 5, and the third electrode pair 7 can be increased, with a probability of water vapor intrusion being reduced.

As shown in FIG. 6 to FIG. 8, it is worth mentioning that a surface of the first electrode pair 3 has a coated area 312 and an uncoated area 313, a surface the second electrode pair 5 has a coated area 512 and an uncoated area 513, and the third electrode pair 7 has a coated area 712 and an uncoated area 713. The uncoated areas 313, 513, 713 are covered by the body 1, and an auxiliary conductive layer S9 (being shown as dots in each figure) is disposed on each of the coated areas 312, 512, 712. The electrical conductivity of the auxiliary conductive layer S9 is higher than the electrical conductivity of the first electrode pair 3, the second electrode pair 5, and the third electrode pair 7, so as to increase the efficiency of electrical connection of the first light emitting chip S2 and the first electrode pair 3, the second light emitting chip S3 and the second electrode pair 5, and the third light emitting chip S4 and the third electrode pair 7 with each other. At the same time, the auxiliary conductive layer S9 can be used to reflect lights emitted by the first light emitting chip S2, the second light emitting chip S3, and the third light emitting chip S4, so as to increase an utilization rate of lights emitted by the first light emitting chip S2, the second light emitting chip S3, and the third light emitting chip S4. Specifically speaking, the first electrode pair 3, the second electrode pair 5, and the third electrode pair 7 could be a copper sheet, and a material of the auxiliary conductive layer S9 could be gold, silver, copper, iron, chromium, nickel, platinum, palladium, and any combination thereof.

In practice, an area of the two first electrode sheets 31 of the first electrode pair 3 that is exposed from the first cavity 11 can essentially be the coated area 312 that has the auxiliary conductive layer S9 disposed thereon. An area of the two second electrode sheets 51 of the second electrode pair 5 that is exposed from the second cavity 12 can essentially be the coated area 512 that has the auxiliary conductive layer S9 disposed thereon. An area of the two third electrode sheets 71 of the third electrode pair 7 that is exposed from the third cavity 13 can essentially be the coated area 712 that has the auxiliary conductive layer S9 disposed thereon. Through a configuration of the auxiliary conductive layer S9, the efficiency of electrical connection of the first light emitting chip S2 and the first electrode pair 3, the second light emitting chip S3 and the second electrode pair 5, and the third light emitting chip S4 and the third electrode pair 7 with each other can be increased. In addition, the utilization rate of the lights emitted by the first light emitting chip S2, the second light emitting chip S3, and the third light emitting chip S4 can be increased with the auxiliary conductive layer S9 being used to reflect the lights emitted by the first light emitting chip S2, the second light emitting chip S3, and the third light emitting chip S4.

Furthermore, a surface roughness of the uncoated area 313 of each of the first electrode sheets 31, the uncoated area 513 of each of the second electrode sheets 51, and the uncoated area 713 of each of the third electrode sheets 71 is greater than a surface roughness of the coated area 312 of each of the first electrode sheets 31, the coated area 512 of each of the second electrode sheets 51, and the coated area 712 of each of the third electrode sheets 71. The uncoated areas 313, 513, 713 are capable of increasing the strength of mechanical connection between the body 1 and each of the first electrode sheets 31, each of the second electrode sheets 51, and each of the third electrode sheets 71, respectively. More specifically, during an actual manufacturing process of the light emitting device Sof the present disclosure, before having the first electrode pair 3, the second electrode pair 5, and the third electrode pair 7 covered by the body 1 through a technique of injection molding, the uncoated area 313 of the each of the first electrode sheets 31, the uncoated area 513 of the each of the second electrode sheets 51, and the uncoated area 713 of the each of the third electrode sheets 71 are pretreated with a surface roughening process (e.g., a blasting process), such that the auxiliary conductive layer S9 is formed on the coated area 312 of the each of the first electrode sheets 31, the coated area 512 of the each of the second electrode sheets 51, and the coated area 712 of the each of the third electrode sheets 71. Accordingly, after the first electrode pair 3, the second electrode pair 5, and the third electrode pair 7 are covered by the body 1 through the technique of injection molding, the strength of mechanical connection between the body 1 and the uncoated area 313 of each of the first electrode sheets 31, the uncoated area 513 of each of the second electrode sheets 51, and the uncoated area 713 of each of the third electrode sheets 71 would be relatively improved.

As shown in FIG. 7, FIG. 8 and FIG. 10, in the embodiment in which the two first electrode sheets 31 of the first electrode pair 3, the two second electrode sheets 51 of the second electrode pair 5, and the two third electrode sheets 71 of the electrode pair 7 are formed through injection molding by the body 1, to increase the strength of mechanical connection between the body 1 and each of the first electrode sheets 31, each of the second electrode sheets 51, and each of the third electrode sheets 71, the second electrode pair 5 and the body 1 have first fitting portions 514 and second fitting portions 23, respectively, and the third electrode pair 7 and the body 1 have first fitting portions 714 and second fitting portions 24, respectively. The first fitting portions 514 and the second fitting portions 23 are cooperatively fitted together, and the first fitting portions 714 and the second fitting portions 24 are cooperatively fitted together. For example, the first fitting portion 514 of each of the second electrode sheets 51 of the second electrode pair 5 can be a recess, and the first fitting portion 714 of each of the third electrode sheets 71 of the third electrode pair 7 can be a recess. The recesses are filled by parts of the body 1 (i.e., the second fitting portions 23, 24 ) when the second electrode pair 5 and the third electrode pair 7 are covered by the body 1 through injection molding. Naturally, in a different embodiment, the first fitting portions 514 of the second electrode pair and the first fitting portions 714 of the third electrode pair can be of a protruding structure, such as a protruding column, but the present disclosure is not limited thereto.

As shown in FIG. 7 and FIG. 8, in a preferred embodiment, the first fitting portions 514 of the second electrode pair 5 are droplet-shaped recesses, and each of the second electrode sheets 51 has the droplet-shaped recess disposed thereon. The first fitting portions 714 of the third electrode pair 7 are droplet-shaped recesses, and each of the third electrode sheets 71 has the droplet-shaped recess disposed thereon. In addition, from the top view of the light emitting device S(as shown in FIG. 6), a part of the first fitting portion 514 of each of the second electrode sheets 51 of the second electrode pair 5 is located in the second cavity 12, and a part of the first fitting portion 714 of each of the third electrode sheets 71 of the third electrode pair 7 is located in the third cavity 13. In this way, the strength of mechanical connection between the body 1 and each of the second electrode sheets 51 and each of the third electrode sheets 71 can be further increased.

As described above, through a design of each of the second electrode sheets 51 having the droplet-shaped recess disposed thereon and the droplet-shaped recesses of the two second electrode sheets 51 being correspondingly disposed at two corners of the second cavity 12, not only would the second encapsulant S6 be connected with side walls forming the second cavity 12, but the second encapsulant S6 would be connected with the second fitting portions 23 of the body 1 that are filled in the droplet-shaped recesses, so as to greatly increase the strength of mechanical connection between corners of the second encapsulant S6 and the body 1. Similarly, through a design of each of the third electrode sheets 71 having the droplet-shaped recess disposed thereon and the droplet-shaped recesses of the two third electrode sheets 71 being correspondingly disposed at two corners of the third cavity 13, not only would the third encapsulant S7 be connected with side walls forming the third cavity 13, but the third encapsulant S7 would be connected with the second fitting portions 24 of the body 1 that are filled in the droplet-shaped recesses, so as to greatly increase the strength of mechanical connection between the body 1 and corners of the third encapsulant S7, and further reduce water vapor intrusion, thereby enhancing a reliability of the entire light emitting device S.

Referring to FIG. 5 and FIG. 11, in practice, the body 1 can further include an auxiliary low wall 25 that is located in the first cavity 11. The auxiliary low wall 25 is located on one of the first electrode sheets 31 of the first electrode pair 3, and is cooperatively fitted with an auxiliary fitting portion 314 of the first electrode pair 3. Specifically speaking, as the auxiliary fitting portion 314 of the first electrode sheet 31 is a recess formed in the first electrode pair 3 by the body 1 through injection molding, a part of the auxiliary low wall 25 is correspondingly fitted in the recess of the first electrode sheets 31. Accordingly, the strength of mechanical connection between the first electrode pair 3 and the body 1 is increased. In addition, through a design of the auxiliary low wall 25, the strength of mechanical connection between a reflective filler S10 and the body 1 is simultaneously increased.

Referring to FIG. 10 to FIG. 13, sectional schematic views taken at different locations of the light emitting device without having the lens, the first encapsulant, the second encapsulant, the third encapsulant, and a reflective filler disposed thereon according to the present disclosure are shown. As shown in FIG. 10, in practice, the first partition wall 18 is located at a side surface of the first cavity 11, and an included angle θ1 with respect to a vertical plane is between 15 to 25 degrees. The second partition wall 19 is located at a side surface of the first cavity 11, and an included angle θ2 with respect to the vertical plane is between 15 to 25 degrees. Preferably, the included angle θ1 and the included angle θ2 can be 21 degrees. In this way, the light emitted by the first light emitting chip S2 would not be easily interfered by the first partition wall 18 and the second partition wall 19, and the light emitted by the first light emitting chip S2 from the first cavity 11 would have a better light-emitting angle.

In addition, in an embodiment in which the reflective filler S10 is disposed in the first cavity 11, through a design of the included angle θ1 and the included angle θ2 being between 15 and 25 degrees, when the reflective filler S10 is formed in the first cavity 11, a problem of the reflective filler S10 being overflown to a surface of the first light emitting chip S2, thereby affecting a light-emitting efficiency of the first light emitting chip S2, can be prevented.

As shown in FIG. 10, an included angle θ3 of an outer side surface forming the second cavity 12 with respect to the vertical plane can be between 15 and 20 degrees, and an included angle θ4 of an outer side surface forming the third cavity 13 with respect to the vertical plane can be between 15 and 20 degrees. An included angle θ5 of an inner side surface forming the second cavity 12 with respect to the vertical plane can be between 5 and 15 degrees, and an included angle θ6 of an inner side surface forming the third cavity 13 with respect to the vertical plane can be between 5 and 15 degrees.

Preferably, the included angle θ3 and the included angle θ4 are 17 degrees, and the included angle θ5 and the included angle θ6 are 17 degrees. In this way, an optical design with a better light-emitting angle can be achieved when lights emitted by the second light emitting chip S3 and the third light emitting chip S4 pass through the second cavity 12 and the third cavity 13, respectively.

Furthermore, referring to FIG. 6 again, in the embodiment in which the second light emitting chip S3 and the third light emitting chip S4 respectively emit blue lights, and the second encapsulant S6 and the third encapsulant S7 are respectively filled with the phosphor, from the top view of the light emitting device S, an outer side surface 12A forming the second cavity 12 is arc-shaped, and an outer side surface 13A forming the third cavity 13 is arc-shaped, so as to enhance a mixed light effect of the blue light emitted by the second light emitting chip S3 and the blue light emitted by the third light emitting chip S4 with the phosphor of the second encapsulant S6 and the phosphor of the third encapsulant S7, respectively.

Figure 9:
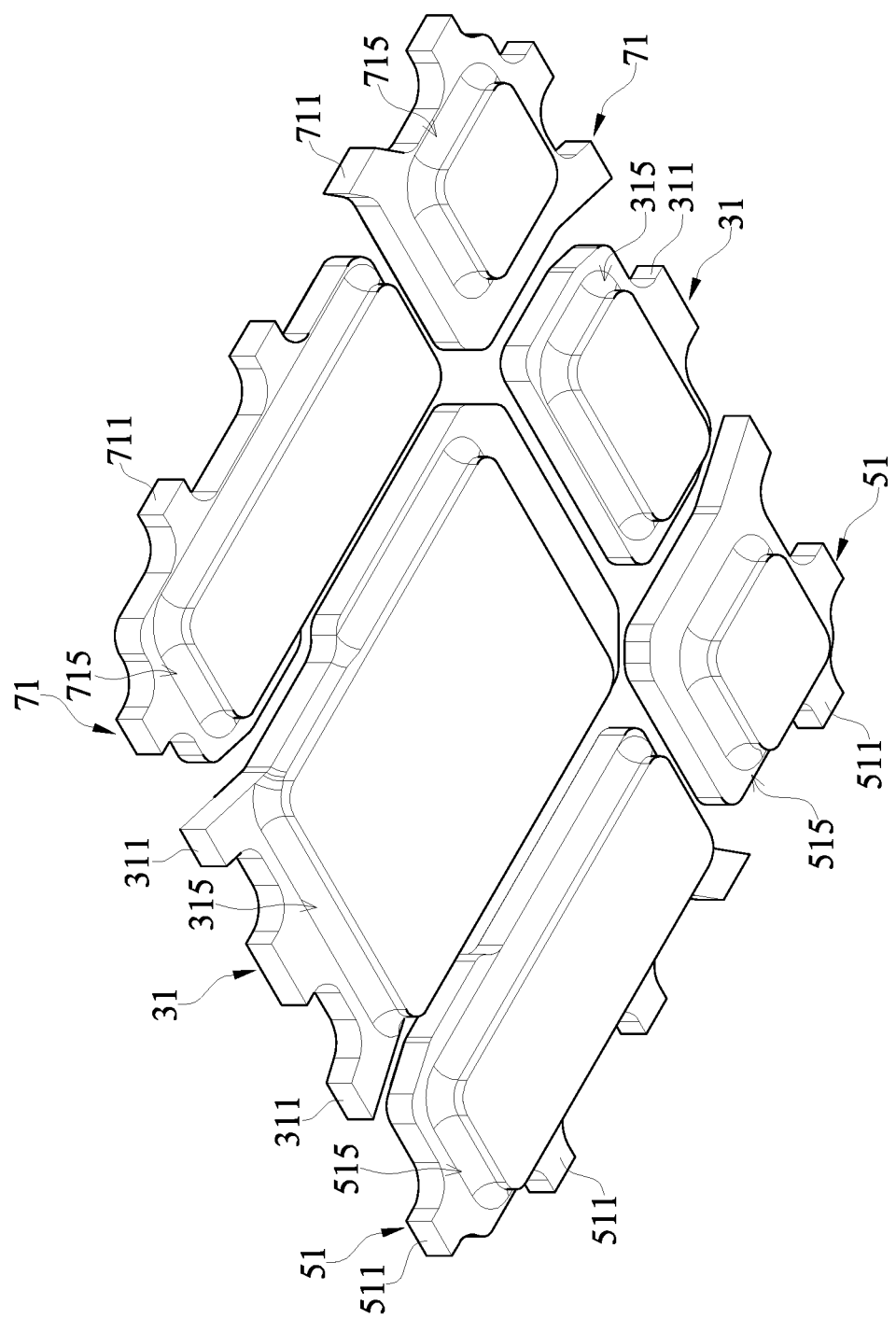
FIG. 9 is a schematic view of the first electrode pair, the second electrode pair, and the third electrode pair of the light emitting device of the present disclosure from another perspective.

References are made to FIG. 9 and FIG. 11 to FIG. 13, in which FIG. 9 is a schematic view of the first electrode pair, the second electrode pair, and the third electrode pair of the light emitting device of the present disclosure from another perspective, FIG. 11 is a sectional schematic view taken along line XI of FIG. 5, FIG. 12 is a sectional schematic view taken along line XII of FIG. 5, and FIG. 13 is a sectional schematic view taken along line XIII of FIG. 5. A concave structure 315 is formed in each of the first electrode sheets 31 of the first electrode pair 3, a concave structure 515 is formed in each of the second electrode sheets 51 of the second electrode pair 5, and a concave structure 715 is formed in each of the third electrode sheets 71 of the third electrode pair 7. The body 1 correspondingly has auxiliary fitting portions 26, 27, and 28. Specifically speaking, when the first electrode pair 3, the second electrode pair 5, and the third electrode pair 7 are formed by the body 1 through injection molding, parts of the body 1 are cooperatively fitted with the concave structure 315 of each of the first electrode sheets 31, the concave structure 515 of each of the second electrode sheets 51, and the concave structure 715 of each of the third electrode sheets 71. The parts of the body 1 that are cooperatively fitted with the concave structures 315, 515, 715 are the auxiliary fitting portions 26, 27, 28, respectively. Through a design of the concave structures 315, 515, 715, there is increased strength of mechanical connection between the body 1 and each of the first electrode sheets 31 of the first electrode pair 3, each of the second electrode sheets 51 of the second electrode pair 5, and each of the third electrode sheets 71 of the third electrode pair 7, respectively.

Referring to FIG. 13, a schematic view of another embodiment of the lighting emitting device without having the first encapsulant, the second encapsulant, and the third encapsulant disposed thereon according to the present disclosure is shown. The main difference of the present embodiment (as shown in FIG. 13) from the previous embodiment (as shown in FIG. 5) is that the light emitting device Scan include the reflective filler S10 that is filled in the first cavity 11. The reflective filler S10 is located between the first encapsulant S5 and the first electrode pair 3, and the reflective filler S10 covers the first electrode pair 3 and encloses a side surface S21 of the first light emitting chip S2. Preferably, an upper surface of the reflective filler S10 is slightly lower than or flush with an upper surface of the first light emitting chip S2. The reflective filler S10 can reflect light emitted by the first light emitting chip S2, and render most of the light emitted by the first light emitting chip S2 to be projected out through the first opening 111 of the first cavity 11, thereby increasing a usage efficiency of the light emitted by the first light emitting chip S2. In actual testing, if the body 1 is made of a material that can reflect the light emitted by the first light emitting chip S2, a light-emitting efficiency of the light emitting chip S2 that is disposed with the reflective filler S10 is 10% higher than a light-emitting efficiency of the light emitting chip S2 that is not disposed with the reflective filler S10. The reflective filler S10 can be, for example, titanium dioxide (TiO2), silicon dioxide (SiO2) or boron nitride (BN).

It is worth mentioning that, in the embodiment in which the first cavity has the reflective filler S10 disposed therein, the first low wall 20 can be in an annular shape, and the first low wall 20 and one of the first electrode sheets 31 together form a recess 221. When the reflective filler S10 is filled in the first cavity 11, part of the reflective filler S10 is filled in the recess 221. In this way, the strength of mechanical connection between the reflective filler S10 and the body 1 is increased.

Figure 15:
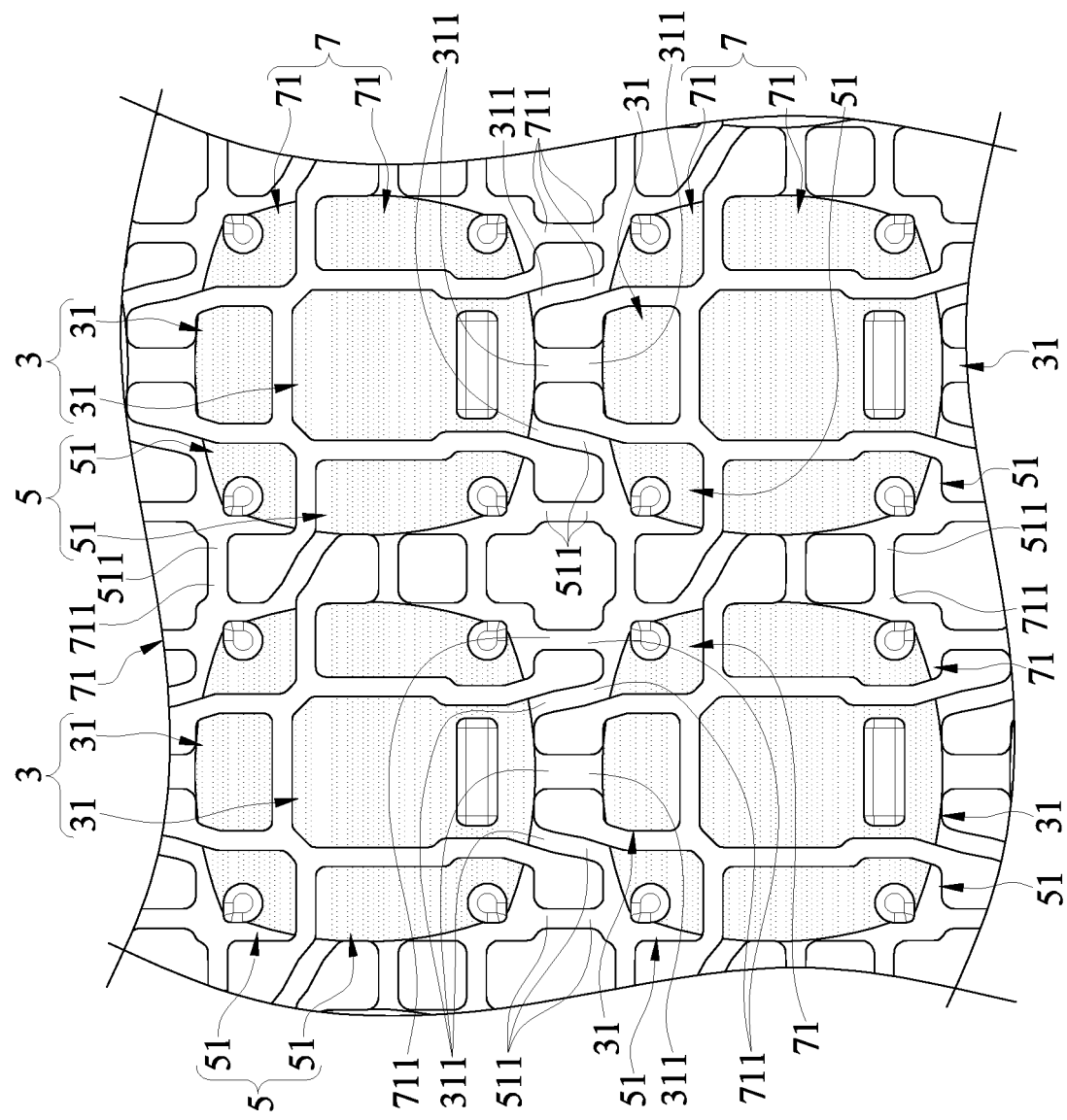
FIG. 15 is a top schematic view of a manufacturing process of the first electrode pair, the second electrode pair, and the third electrode pair in a plurality of light emitting devices according to the present disclosure.

Reference is made to FIG. 15, which illustrates a top schematic view of a manufacturing process of the first electrode pair, the second electrode pair, and the third electrode pair in a plurality of light emitting devices according to the present disclosure. In practice, the first electrode pair 3, the second electrode pair 5, and the third electrode pair 7 in the plurality of light emitting devices S (the package structure S1) can be manufactured together. Each of the first electrode sheets 31 has three first extension portions 311, and the three first extension portions 311 are connected with a first extension portion 311 of an adjacent first electrode sheet 31, a second extension portion 511 of an adjacent second electrode sheet 51, and a third extension portion 711 of an adjacent third electrode sheet 71. That is to say, through the three first extension portions 311, each of the first electrode sheets 31 is connected with the adjacent second electrode sheet 51 and the adjacent third electrode sheet 71. In this way, an islanding condition caused by the second electrode sheets 51 or the third electrode sheets 71 being not connected with other electrode sheets can be prevented. A second extension portion 511 of each of the second electrode sheets 51 can be connected with second extension portions 511 of adjacent two second electrode sheets 51, or the second extension portion 511 of the each of the second electrode sheets 51 can be connected with third extension portions 711 of two third electrode sheets 71. A third extension portion 711 of each of the third electrode sheets 71 can be connected with third extension portions 711 of an adjacent third electrode sheet 71, or the third extension portion 711 of the each of the third electrode sheets 71 can be connected with second extension portions 511 of an adjacent second electrode sheet 51. In this way, a stability of each of the first electrode sheets 31, each of the second electrode sheets 51, and each of the third electrode sheets 71 being formed in the body 1 would be greatly increased. In addition, during a molding process of each of the first electrode sheets 31 in the body 1, the islanding condition is prevented. Naturally, in practice, connections among each of the first electrode sheets 31, each of the second electrode sheets 51, and each of the third electrode sheets 71 are not limited to the above description.

In conclusion, the light emitting device of the present disclosure, when being applied in the devices for facial image capturing and car plate recognition, has the advantage of being small in size compared to conventional light emitting devices. In addition, according to the present disclosure, an infrared light emitted by the first light emitting chip of the light emitting device would not be interfered by the light emitted by the second light emitting chip and the light emitted by the third light emitting chip. Further, compared to the conventional light emitting device, the light emitting device of the present disclosure has the advantage of having better light-emitting efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting device, comprising:
   a package structure, including:
      a first electrode pair, a second electrode pair, and a third electrode pair; and
      a body covering the first electrode pair, the second electrode pair, and the third electrode pair, the body including:
         a first cavity, a second cavity, and a third cavity being disposed corresponding to the first electrode pair, the second electrode pair, and the third electrode pair, respectively, and exposing the first electrode pair, the second electrode pair, and the third electrode pair, respectively;
      a first light emitting chip, a second light emitting chip, and a third light emitting chip being disposed in the first cavity, the second cavity, and the third cavity, respectively, and being electrically connected with the first electrode pair, the second electrode pair, and the third electrode pair, respectively; and
      a first encapsulant, a second encapsulant, and a third encapsulant being disposed in the first cavity, the second cavity, and the third cavity, respectively, and covering the first light emitting chip, the second light emitting chip, and the third light emitting chip, respectively;
   wherein the first cavity, the second cavity, and the third cavity have a first opening, a second opening, and a third opening, respectively, an area of the first opening being larger in size than an area of the second opening, and the area of the first opening being larger in size than an area of the third opening;
   wherein a wavelength of a light emitted by the first light emitting chip is different from a wavelength of a light emitted by the second light emitting chip, and the wavelength of the light emitted by the first light emitting chip is different from a wavelength of a light emitted by the third light emitting chip.

2. The light emitting device according to claim 1, wherein the first light emitting chip emits an infrared light.

3. The light emitting device according to claim 2, wherein the second light emitting chip and the third light emitting chip emit a blue light.

4. The light emitting device according to claim 3, wherein the second encapsulant and the third encapsulant each contain a wavelength conversion material; wherein lights emitted by the second light emitting chip and the third light emitting chip, after respectively passing through the second encapsulant and the third encapsulant, are partially converted and mixed into white light.

5. The light emitting device according to claim 4, wherein a color temperature of the white light ranges from 2500 Kelvin (K) to 6500 Kelvin (K).

6. The light emitting device according to claim 1, further comprising a lens being disposed on a top surface of the body.

7. The light emitting device according to claim 1, further comprising a reflective filler, the reflective filler being filled in the first cavity, being located between the first encapsulant and the first electrode pair, and covering the first electrode pair and enclosing a side surface of the first light emitting chip.

8. The light emitting device according to claim 1, wherein from a top view of the light emitting device, the area of the first opening is two to three times that of the second opening, and the area of the first opening is two to three times that of the third opening.

9. The light emitting device according to claim 1, wherein the body further includes a first partition wall and a second partition wall, the first partition wall being located between the first cavity and the second cavity, the second partition wall being located between the first cavity and the third cavity, and the first partition wall and the second partition wall each having two curved segments.

10. The light emitting device according to claim 9, wherein a height of the first partition wall is equal to a height of the second partition wall.

11. The light emitting device according to claim 9, wherein one curved segment of the first partition wall bends toward the second cavity, and another curved segment of the first partition wall bends toward the first cavity;

wherein one curved segment of the second partition wall bends toward the third cavity, and another curved segment of the second partition wall bends toward the first cavity.

12. The light emitting device according to claim 9, wherein the body further includes a first low wall, a second low wall, and a third low wall that are disposed in the first cavity, the second cavity, and the third cavity, respectively.

13. The light emitting device according to claim 9, wherein the body further includes an auxiliary low wall, the first electrode pair includes an auxiliary fitting portion, and the auxiliary low wall and the auxiliary fitting portion are fitted to each other and cover part of the first electrode pair.

\* \* \* \* \*